(12) United States Patent
Doo et al.

(10) Patent No.: US 11,705,825 B2
(45) Date of Patent: Jul. 18, 2023

(54) INVERTER INSULATOR APPARATUS AND METHOD

(71) Applicant: Rivian IP Holdings, LLC, Plymouth, MI (US)

(72) Inventors: Young Mok Doo, La Palma, CA (US); Juan Lopez, Wildomar, CA (US); Shawn Merritt, Lomita, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 411 days.

(21) Appl. No.: 16/945,126

(22) Filed: Jul. 31, 2020

(65) Prior Publication Data
US 2022/0038021 A1 Feb. 3, 2022

(51) Int. Cl.
*H05K 3/30* (2006.01)
*H02M 7/00* (2006.01)
*H05K 1/02* (2006.01)

(52) U.S. Cl.
CPC .......... *H02M 7/003* (2013.01); *H05K 1/0256* (2013.01); *H05K 3/303* (2013.01); *H05K 2203/167* (2013.01)

(58) Field of Classification Search
CPC ...... H05K 3/306; H05K 3/363; H05K 3/4015; H05K 3/303; H05K 1/144; H05K 1/0296; H05K 1/184; H05K 1/0256; H05K 2201/041; H05K 2201/10303; H05K 2203/167; H02M 7/003
See application file for complete search history.

(56) References Cited

U.S. PATENT DOCUMENTS

| | | | |
|---|---|---|---|
| 7,505,294 B2 * | 3/2009 | Ahmed | H02M 7/53871 363/141 |
| 2016/0029478 A1 * | 1/2016 | Bayerer | H05K 3/30 361/736 |

* cited by examiner

*Primary Examiner* — Bryan R Perez
(74) *Attorney, Agent, or Firm* — Clements Bernard Walker; Christopher L. Bernard

(57) ABSTRACT

Disclosed embodiments include alignment apparatuses for circuit boards, inverter assemblies, and methods for fabricating an assembly with a circuit board placed on an alignment apparatus. An illustrative apparatus includes an electrically insulative substrate having a first substantially planar surface and a second substantially planar surface forming an opposing side of the first substantially planar surface. The second substantially planar surface defines therein self-aligning features that are configured to align at least one power module pin with the electrically insulative substrate. The first substantially planar surface has at least one alignment feature configured to align a printed circuit board with the electrically insulative substrate. The apparatus also includes a routing feature coupled to the electrically insulative substrate. The routing feature is configured to route at least one low voltage conductor.

18 Claims, 3 Drawing Sheets

INVERTER INSULATOR APPARATUS AND METHOD

INTRODUCTION

The present disclosure relates to assembly of inverter parts for electric vehicles. The statements in this section merely provide background information related to the present disclosure and may not constitute prior art.

An inverter is an integral part of most electric vehicles which are powered by direct current (DC) power packs to drive alternating current (AC) motors. The inverter power switching module is the main component of the inverter and contains one or more electrical circuit boards. One board of the inverter may be a gate drive board. The gate drive board may have a number of plated thru holes through which a number of contact pins must be fed through during assembly. This requires very precise alignment to do so. Alignment issues during assembly may cause assembly failures or component damages. Some inverter boards also do not always provide substantial electrical isolation from other parts and in some instances also may lead to failure.

SUMMARY

Disclosed embodiments include alignment apparatuses for circuit boards, inverter assemblies, and methods for fabricating an assembly with a circuit board placed on an alignment apparatus.

In an illustrative embodiment an apparatus includes an electrically insulative substrate having a first substantially planar surface and a second substantially planar surface forming an opposing side of the first substantially planar surface. The second substantially planar surface defines therein self-aligning features that are configured to align at least one power module pin with the electrically insulative substrate. The first substantially planar surface has at least one alignment feature configured to align a printed circuit board with the electrically insulative substrate. The apparatus also includes a routing feature coupled to the electrically insulative substrate. The routing feature is configured to route at least one low voltage conductor.

In another illustrative embodiment an inverter assembly includes an inverter power module having at least one electrical connector pin. The inverter assembly also includes a printed circuit board. Further, the inverter assembly includes an electrically insulative substrate having a first substantially planar surface and a second substantially planar surface forming an opposing side of the first substantially planar surface. The second substantially planar surface defines therein self-aligning features that are configured to align the at least one electrical connector pin with the electrically insulative substrate. The first substantially planar surface has at least one alignment feature configured to align the printed circuit board with the electrically insulative substrate. Further still, a routing feature is coupled to the electrically insulative substrate configured to rout at least one low voltage conductor coupled to the printed circuit board.

In another illustrative embodiment a method includes providing an electrically insulative substrate having a first substantially planar surface and a second substantially planar surface forming an opposing side of the first substantially planar surface. The second substantially planar surface defines self-aligning features therein including apertures defined therein and the first substantially planar surface has at least one printed circuit board alignment feature. The method further includes placing the electrically insulative substrate adjacent the second substantially planar surface such that at least one electrical connector pin of a power module is extendible through at least one aperture in the self-aligning features. Further still, the method includes placing a printed circuit board over the first substantially planar surface being aligned with the at least one printed circuit board alignment feature.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Illustrative embodiments are illustrated in referenced figures of the drawings. It is intended that the embodiments and figures disclosed herein are to be considered illustrative rather than restrictive.

Like reference symbols in the various drawings generally indicate like elements.

DETAILED DESCRIPTION

Figure 1:
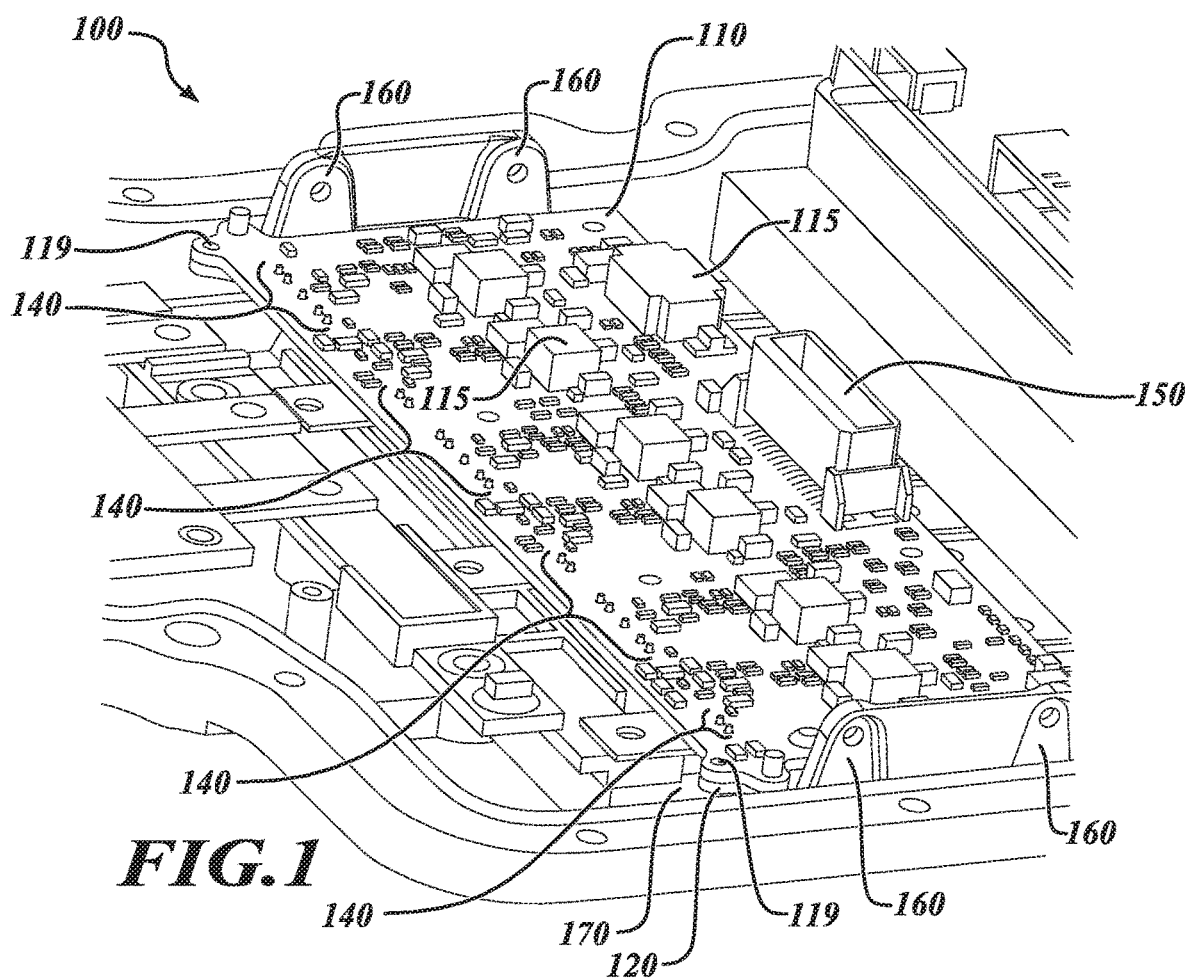
FIG. 1 is a perspective view of an illustrative circuit board assembly with an illustrative mounting component for electric inverter circuitry having circuitry mounted thereon.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Given by way of non-limiting overview, disclosed embodiments include alignment apparatuses for circuit boards, inverter assemblies, and methods for fabricating methods for fabricating an assembly with a circuit board placed on an alignment apparatus.

Figure 2:
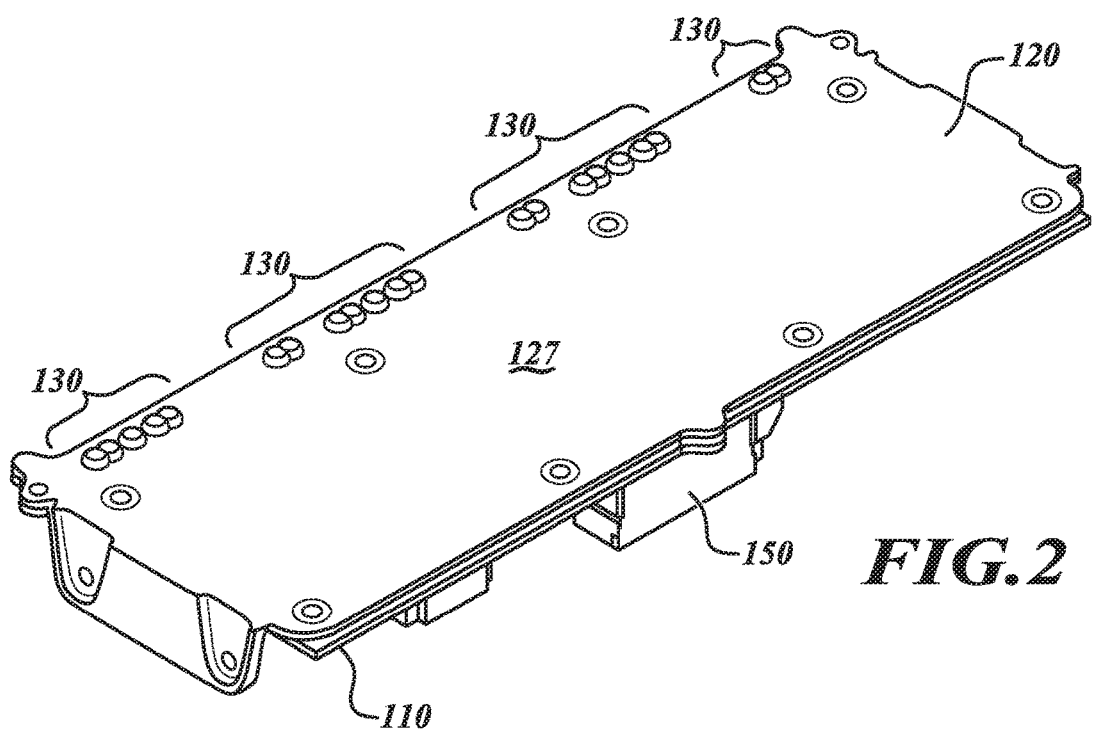
FIGS. 2 and 3 are perspective views of a reverse side of the mounting component of FIG. 1.
Figure 3:
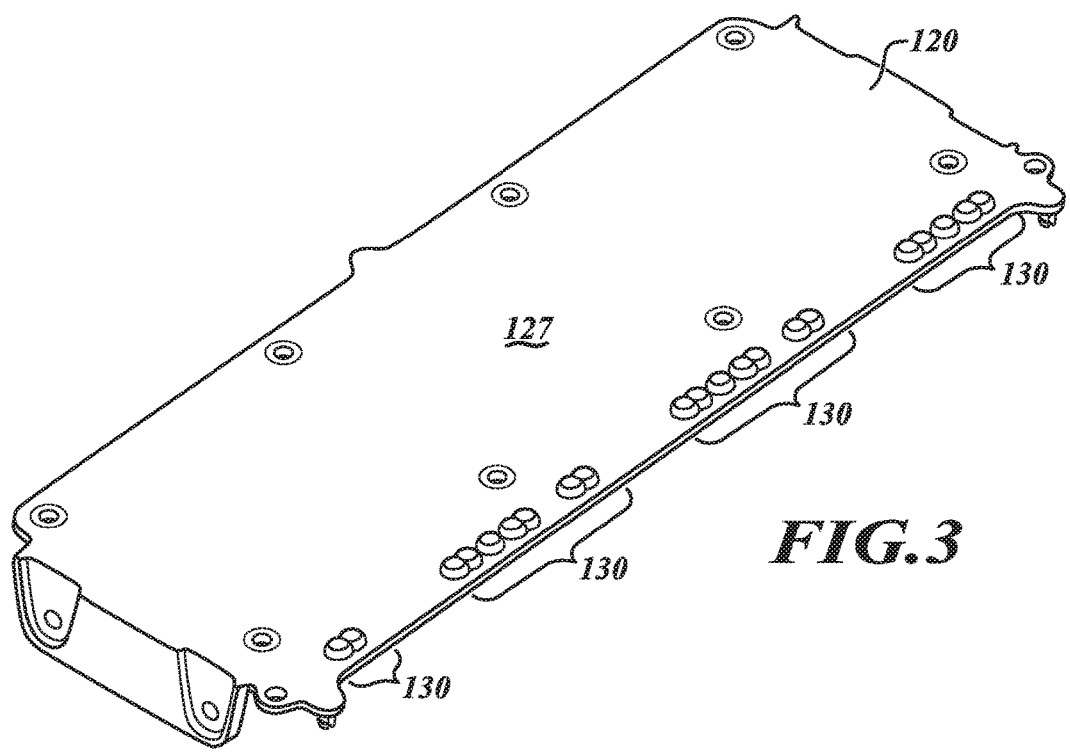
Figure 4:
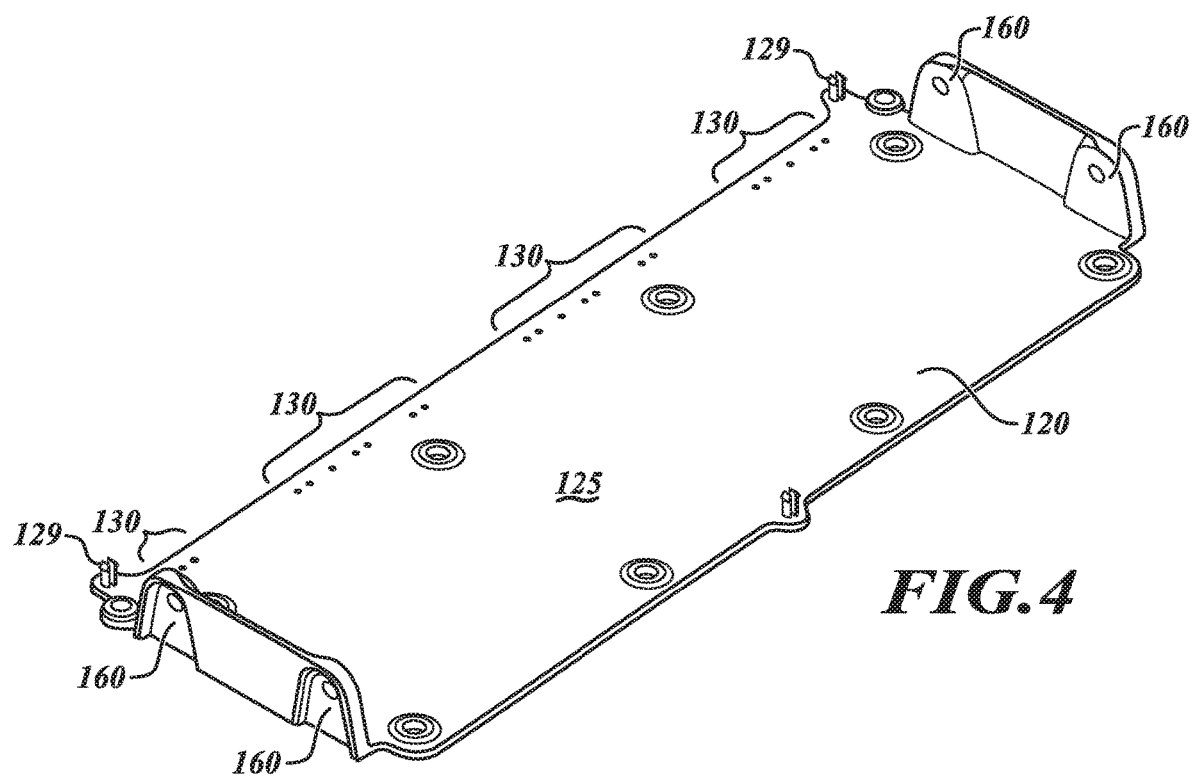
FIG. 4 is a perspective view of the mounting component of FIG. 1.
Figure 5:
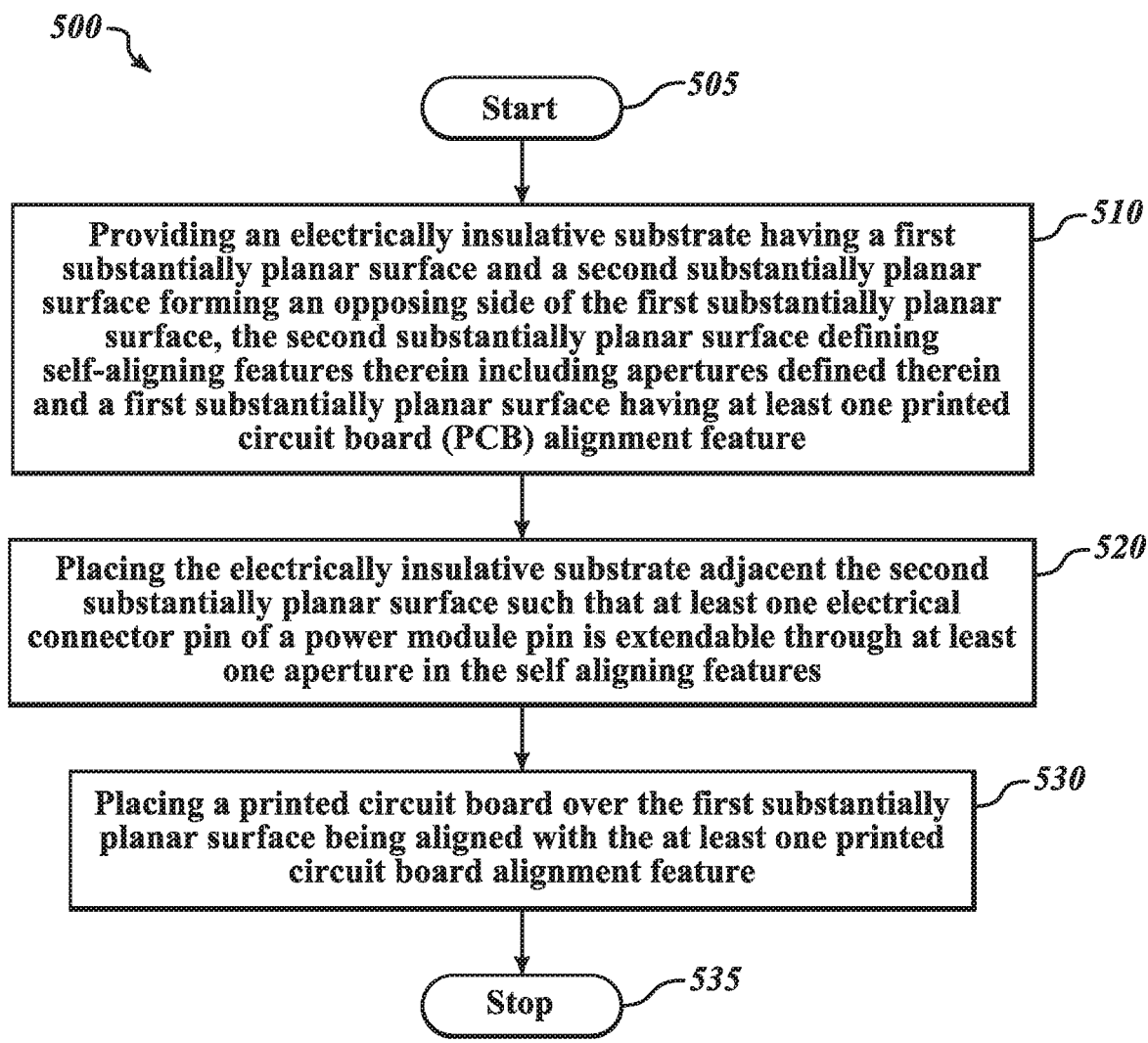
FIG. 5 is a flow chart of an illustrative method for fabricating the assembly of FIG. 1.

Referring to FIG. 1, in various embodiments an illustrative inverter gate drive board assembly 100 includes an inverter gate drive circuit board 110 having deposited thereon electrical circuit elements 115. The circuit board 110 may be mounted to an electrically insulative substrate 120 having a first substantially planar surface 125 (FIG. 4). The circuit board 110 is aligned with the substrate 120 by inserting alignment fasteners or pins 129 into apertures 119 in the circuit board 110. The substrate 120 includes a second substantially planar surface 127 forming an opposing side of the first substantially planar surface 125 (FIGS. 2 and 3). The second substantially planar surface 125 has defined therein self-aligning features 130 that are configured to align at least one power module pin 140 with the electrically insulative substrate 120 and subsequently with the circuit board 110. The first substantially planar surface 125 may have at least one alignment feature, such as, but not limited to, self-aligning features 130 that are configured to align the printed circuit board 110 with the power module pins 140 that extend from an inverter power module 170. The printed circuit board may include any of a variety of electrical circuit elements and chips as well as including wiring connector ports, such as port 150 for connecting the printed circuit board with other devices and controllers.

In various embodiments, a routing feature 160 may be coupled to the electrically insulative substrate 120, and the routing feature 160 may be configured to rout at least one low voltage conductor or low voltage conductor harness through it. As depicted, the routing feature 160 includes a post with an aperture therethrough. However, the routing feature 160 is not limited to the configuration disclosed but may be any structure that helps to route or hold the low voltage conductor or low voltage harness in place.

In various embodiments, the self-aligning features 130 include partially conical shaped depressions formed in the second substantially planar surface 127. Each of the self-aligning features 130 may be partially conical shaped depressions and may include an aperture which is configured to accommodate one or more power module pins 140 extending therethrough. These pins 140 are, when assembled, electrically coupled to circuit board 110. The number of pins 140 and self-aligning features 130 should not be seen as limiting as any number of pins may be used dependent on the power module and inverter circuit design.

In various embodiments, an illustrative method of assembly 500 starts at block 505. An electrically insulative substrate is provided at a block 510. The insulative substrate has a first substantially planar surface and a second substantially planar surface forming an opposing side of the first substantially planar surface. The second substantially planar surface defines self-aligning features therein including apertures defined therein and the first substantially planar surface has at least one printed circuit board alignment feature. At a block 520, the electrically insulative substrate is placed adjacent the second substantially planar surface such that at least one electrical connector pin of a power module is extendible through at least one aperture in the self-aligning features. At a block 530, a printed circuit board is placed over the first substantially planar surface that is aligned with the at least one printed circuit board alignment feature. The method 500 stops at a block 535.

Illustrative embodiments may be used in constructing components of electric vehicles but are not limited thereto. The insulative substrate 120, as generally configured, may help to resolve issues with aligning inverter power switching module pins with inverter gate drive printed circuit boards during assembly. In various embodiments, twenty-one pins are to be aligned. These twenty-one pins are to be fed through thru holes of a circuit board and be soldered. However, it will be appreciated that any number of pins may be used as desired for a particular application and no limitation to any number of pins whatsoever is intended to be implied and is not to be inferred. Misalignment of these pins to holes may contribute to causing damage to parts and may contribute to causing assembly failures. Adding the insulative substrate 120 to hold down the circuit board and adding self-aligning features can help contribute to enabling simplified alignment. The self-aligning features, being partially conically shaped, can help contribute to enabling guiding alignment of the inverter module pins through the circuit board thru holes.

In addition to helping address possible issues with module/pin alignment, the insulative substrate 120 may also provide electrical isolation between electrical connections and metal parts of the chassis. It will also be appreciated that the insulative substrate 120 may help contribute to providing harness routing features through which wiring harnesses can be threaded or supported.

In some instances, one or more components may be referred to herein as "configured to," "configured by," "configurable to," "operable/operative to," "adapted/adaptable," "able to," "conformable/conformed to," etc. Those skilled in the art will recognize that such terms (e.g. "configured to") generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

While the disclosed subject matter has been described in terms of illustrative embodiments, it will be understood by those skilled in the art that various modifications can be made thereto without departing from the scope of the claimed subject matter as set forth in the claims.

What is claimed is:

1. An apparatus comprising:
   an electrically insulative substrate having a first substantially planar surface and a second substantially planar surface forming an opposing side of the first substantially planar surface, the second substantially planar surface defining therein self-aligning features that are configured to align at least one power module pin with the electrically insulative substrate, the self-aligning features including partially conical shaped depressions formed in the second substantially planar surface, the first substantially planar surface having at least one alignment feature configured to align a printed circuit board with the electrically insulative substrate; and
   a routing feature coupled to the electrically insulative substrate, the routing feature being configured to route at least one low voltage conductor.

2. The apparatus of claim 1, wherein the self-aligning features include at least five partially conical shaped depressions formed in the second substantially planar surface.

3. The apparatus of claim 2, wherein the self-aligning features include at least ten partially conical shaped depressions formed in the second substantially planar surface.

4. The apparatus of claim 3, wherein the self-aligning features include at least twenty partially conical shaped depressions formed in the second substantially planar surface.

5. The apparatus of claim 1, wherein the routing feature is configured to accommodate a low voltage conductor harness.

6. The apparatus of claim 1, wherein the routing feature includes a post.

7. The apparatus of claim 1, wherein the routing feature includes an aperture.

8. The apparatus of claim 1, wherein each of the partially conical shaped depressions includes an aperture.

9. An inverter assembly comprising:
   an inverter power module having at least one electrical connector pin;
   a printed circuit board;
   an electrically insulative substrate having a first substantially planar surface and a second substantially planar surface forming an opposing side of the first substantially planar surface, the second substantially planar surface defining therein self-aligning features that are configured to align the at least one electrical connector pin with the electrically insulative substrate, the self-aligning features including partially conical shaped depressions formed in the second substantially planar surface, the first substantially planar surface having at least one alignment feature configured to align the printed circuit board with the electrically insulative substrate; and
   a routing feature coupled to the electrically insulative substrate configured to rout at least one low voltage conductor coupled to the printed circuit board.

10. The inverter assembly of claim 9, wherein self-aligning features formed in the second substantially planar surface include at least five partially conical shaped depressions formed in the second substantially planar surface.

11. The inverter assembly of claim 10, wherein self-aligning features formed in the second substantially planar surface include at least ten partially conical shaped depressions formed in the second substantially planar surface.

12. The inverter assembly of claim 11, wherein self-aligning features formed in the second substantially planar surface include at least twenty partially conical shaped depressions formed in the second substantially planar surface.

13. The inverter assembly of claim 9, wherein the printed circuit board includes a gate drive board.

14. The inverter assembly of claim 9, wherein the routing feature is configured to accommodate a low voltage conductor harness.

15. The inverter assembly of claim 9, wherein the routing feature includes a post.

16. The inverter assembly of claim 9, wherein the routing feature includes an aperture.

17. The inverter assembly of claim 9, wherein each of the partially conical shaped depressions includes an aperture.

18. A method comprising:
    providing an electrically insulative substrate having a first substantially planar surface and a second substantially planar surface forming an opposing side of the first substantially planar surface, the second substantially planar surface defining self-aligning features therein including apertures defined therein, the self-aligning features including partially conical shaped depressions formed in the second substantially planar surface, and the first substantially planar surface having at least one printed circuit board alignment feature;
    placing the electrically insulative substrate adjacent the second substantially planar surface such that at least one electrical connector pin of a power module is extendible through at least one aperture in the self-aligning features; and
    placing a printed circuit board over the first substantially planar surface being aligned with the at least one printed circuit board alignment feature.

* * * * *